(12) United States Patent
Daigo

(10) Patent No.: US 12,516,182 B2
(45) Date of Patent: Jan. 6, 2026

(54) RESIN COMPOSITION, RESIN-ATTACHED METAL FOIL, CURED PRODUCT, METAL-BASED SUBSTRATE, AND ELECTRONIC PART

(71) Applicant: TAIYO HOLDINGS CO., LTD., Saitama (JP)

(72) Inventor: Yoshikazu Daigo, Saitama (JP)

(73) Assignee: TAIYO HOLDINGS CO., LTD., Saitama (JP)

( * ) Notice: Subject to any disclaimer, the term of this patent is extended or adjusted under 35 U.S.C. 154(b) by 367 days.

(21) Appl. No.: 18/249,455

(22) PCT Filed: Jan. 25, 2022

(86) PCT No.: PCT/JP2022/002547
§ 371 (c)(1),
(2) Date: Apr. 18, 2023

(87) PCT Pub. No.: WO2022/163609
PCT Pub. Date: Aug. 4, 2022

(65) Prior Publication Data
US 2025/0075062 A1 Mar. 6, 2025

(30) Foreign Application Priority Data

Jan. 27, 2021 (JP) ................. 2021-010872

(51) Int. Cl.
*C08L 9/00* (2006.01)
*C08K 3/22* (2006.01)
*H05K 1/05* (2006.01)

(52) U.S. Cl.
CPC ............. *C08L 9/00* (2013.01); *C08K 3/22* (2013.01); *H05K 1/05* (2013.01);
(Continued)

(58) Field of Classification Search
None
See application file for complete search history.

(56) References Cited

U.S. PATENT DOCUMENTS

2007/0015872 A1* 1/2007 Arima ............... C08G 65/48
                                                   525/92 F
2016/0183659 A1* 6/2016 Tashiro ............... A45D 31/00
                                                   132/200
(Continued)

FOREIGN PATENT DOCUMENTS

JP      11-17346 A     1/1999
JP   2006-273954 A   10/2006
(Continued)

OTHER PUBLICATIONS

International Search Report issued Mar. 22, 2022 in PCT/JP2022/002547 filed Jan. 25, 2022, (English Translation), citing documents 16-21 therein, 3 pages.

*Primary Examiner* — Peter A Salamon
(74) *Attorney, Agent, or Firm* — Oblon, McClelland, Maier & Neustadt, L.L.P.

(57) ABSTRACT

An object of the present invention is to provide a resin composition having high electrically insulating properties, high thermally conductive properties, low elasticity, and high solder heat resistance as an electrically insulating layer for a metal-based base material to be used for electronic devices, especially for on-vehicle electronic devices, and having favorable workability during coating a body to be coated as a resin composition for an electrically insulating layer before being cured. The present invention provides a thermosetting resin composition, a cured product, and a resin-attached metal foil, each containing a rubber-like polymer compound (A) having a glass transition temperature (Tg) of −40° C. or lower and a weight average molecular weight (Mw) in a range of 8,000 to 50,000, an epoxy resin
(Continued)

(B), a filler (C), and a phenoxy resin (D). The present invention also provides a method for producing a metal-based substrate having any one of the thermosetting resin composition, the cured product, and the resin-attached metal foil, and a method for producing an electronic part using the metal-based substrate.

20 Claims, 2 Drawing Sheets

(52) U.S. Cl.
CPC .. *C08K 2003/2227* (2013.01); *C08L 2203/16* (2013.01); *C08L 2203/20* (2013.01); *C08L 2205/02* (2013.01)

(56) References Cited

U.S. PATENT DOCUMENTS

2017/0369633 A1* 12/2017 Caruso Dailey ......... C08J 3/242
2019/0217576 A1*  7/2019 Kitai ................... C08F 290/062

FOREIGN PATENT DOCUMENTS

| | | |
|---|---|---|
| JP | 2017-84949 A | 5/2017 |
| JP | 2019-166688 A | 10/2019 |
| WO | WO 2005/006826 A1 | 1/2005 |
| WO | WO 2018/173945 A1 | 9/2018 |
| WO | WO 2020/152906 A1 | 7/2020 |

* cited by examiner

RESIN COMPOSITION, RESIN-ATTACHED METAL FOIL, CURED PRODUCT, METAL-BASED SUBSTRATE, AND ELECTRONIC PART

CROSS-REFERENCE TO RELATED APPLICATIONS

This application is a national stage application of International Application No. PCT/JP2022/002547, filed Jan. 25, 2022, which is based upon and claims the benefit of priority to Japanese Patent Application No. 2021-010872, filed Jan. 27, 2021. The entire contents of these applications are incorporated herein by reference.

TECHNICAL FIELD

The present invention relates to a resin composition capable of forming an insulating layer which can be used for an electronic part for example and has excellent electric insulation properties and thermally conductive properties. The present invention also relates to: a cured product of the resin composition; a metal-based substrate having the cured product; a method for producing a metal-based substrate, comprising joining a metal foil onto the cured product of the metal-based substrate using a roll laminating method or a laminating press method; a resin-attached metal foil having the resin composition as a resin layer on a metal foil or a carrier-attached metal foil; a method for producing a metal-based substrate, comprising overlaying a resin layer side of the resin-attached metal foil on a metal substrate, and heating and pressurizing the resin-attached metal foil and the metal substrate with a vacuum press to obtain the metal-based substrate; and a method for producing an electronic part, comprising using the cured product or the metal-based substrate.

BACKGROUND ART

In recent years, as electric and electronic devices, such as home electric appliances, OA equipment, and on-vehicle electronic devices, have become smaller and denser, increases in the quantity of heat generated from electronic parts have become problematic. The reason is that generated heat has an undesired influence on the performance or product life of the devices. Therefore, metal-based substrates having at least an electrically insulating layer provided on a metal substrate having good thermally conductive properties, such as aluminum, copper, or iron so that heat to be generated can be efficiently dissipated are used as substrates for electronic circuits.

The metal-based substrates have higher heat dissipation properties but are more expensive than general substrates made of PCB, and therefore have conventionally been used only for some special substrates for high-voltage use or high-current use. However, with the further spread of high-brightness LED headlights and power devices such as SiC in recent years, such metal-based substrates are being adopted because they are more inexpensive and have better processability than substrates made of ceramics.

Examples of the materials for the electrically insulating layer which is used for metal-based substrates include a resin composition obtained by blending a heat dissipation filler for enhancing the thermally conductive properties in a silicone resin, an epoxy resin, or the like. For example, Patent Document 1 proposes a resin composition for a circuit board, the resin composition containing a vinylsilyl group-containing polysiloxane, a hydrosilyl group-containing polysiloxane, and an inorganic filler.

PRIOR ART DOCUMENT

Patent Document

Patent Document 1
International Publication No. WO 2018/173945

SUMMARY OF INVENTION

Problems to be Solved by the Invention

An electrically insulating layer on a metal-based base material to be used for electronic devices, especially for on-vehicle electronic devices, is required to simultaneously have a plurality of aptitudes, such as to have low elasticity in order to prevent a solder crack, to have resistance to solder heat, and, as a resin composition for an electrically insulating layer before being cured, to have favorable coating properties, such as not causing flow unevenness to occur or not causing a bubble to occur during coating a body to be coated or during pressing, not to mention excellent electrically insulating properties and thermally conductive properties.

With regard to this, in the technique described in Patent Document 1, the insulating layer obtained from the resin composition described in Patent Document 1 has favorable adhesiveness to a metal substrate to a certain extent and has low elasticity, but a silicone resin having high water repellency is used as a base, therefore there is a risk of causing coating unevenness to occur on a metal body to be coated, and thus the technique described in Patent Document 1 does not necessarily take coating properties and further, workability into consideration.

On the other hand, when a rubber-like polymer compound having a relatively large Mw, as large as an Mw of 100,000 or higher, is used, and a heat dissipation filler is blended therein at a high content, a bubble is likely to occur in applying and drying a resultant resin composition and further, there is a risk of causing the insulating layer to swell during heating solder or causing the withstand voltage to lower.

In view of the above viewpoints, an object of the present invention is to provide a resin composition having high electrically insulating properties, high thermally conductive properties, high solder heat resistance, and low elasticity as an electrically insulating layer for a metal-based base material to be used for electronic parts, especially for on-vehicle electronic parts, and having favorable workability during coating a body to be coated as a resin composition for an electrically insulating layer before being cured.

Means for Solving the Problems

As a result of diligent studies, the present inventor has found that by adopting a rubber-like polymer compound having a glass transition temperature in a particular range and a weight average molecular weight in a particular range as a matrix component of a resin composition capable of forming an electrically insulating material, the problems can be solved, and completed the present invention.

That is, the problems to be solved by the present invention can be solved by a thermosetting resin composition comprising:

a rubber-like polymer compound (A) having a glass transition temperature (Tg) of −40° C. or lower and a weight average molecular weight (Mw) in a range of 8,000 to 50,000;

an epoxy resin (B);

a filler (C); and a phenoxy resin (D).

A preferred aspect of the present invention is the thermosetting resin composition, wherein the rubber-like polymer compound has an isoprene or butadiene skeleton.

Particularly, the present invention relates to the thermosetting resin composition, wherein the epoxy resin is preferably liquid at normal temperature (25° C.).

Another aspect of the present invention is a resin-attached metal foil having a B-stage state (semi-cured state) resin layer obtained by heating and drying any one of the above thermosetting resin compositions on a metal foil or a carrier-attached metal foil.

A yet another aspect of the present invention relates to a dry film having a B-stage state (semi-cured state) resin layer obtained by heating and drying any one of the above thermosetting resin compositions on a carrier film. The above-described B-stage state (semi-cured state) resin layer is obtained by heating and drying any one of the above thermosetting resin compositions, for example, at a temperature of 80° C. for about 30 minutes.

A still yet another aspect of the present invention relates to a cured product obtained by curing the resin layer of the resin-attached metal foil or curing the resin layer of the dry film.

A further another aspect of the present invention relates to a metal-based substrate having the cured product on a metal substrate.

In addition, the present invention also relates to a method for producing a metal-based substrate, comprising overlaying a resin layer side of the resin-attached metal foil on one surface or each surface of a metal substrate, and heating and pressurizing the resin-attached metal foil and the metal substrate with a vacuum press.

Furthermore, the present invention also relates to a method for producing a metal-based substrate, comprising overlaying a metal foil on a metal substrate having a B-stage state (semi-cured state) resin layer obtained by applying, heating and drying any one of the above thermosetting resin compositions, and heating and pressurizing the metal foil and the metal substrate with a vacuum press to obtain the metal-based substrate.

Further yet another aspect of the present invention relates to a method for producing an electronic part, comprising using the cured product, the metal-based substrate, or the metal-based substrate obtained by either of the above methods.

Effects of Invention

The present invention can provide an electric insulator having high electrically insulating properties, high thermally conductive properties, high solder heat resistance, and low elasticity as an electrically conductive body for a metal-based base material to be used for an electronic part for example. In addition, the present invention can also provide a thermosetting resin composition having a favorable workability during coating a metal foil as a thermosetting resin composition capable of forming the electric insulator.

MODE FOR CARRYING OUT THE INVENTION

Figure 1:
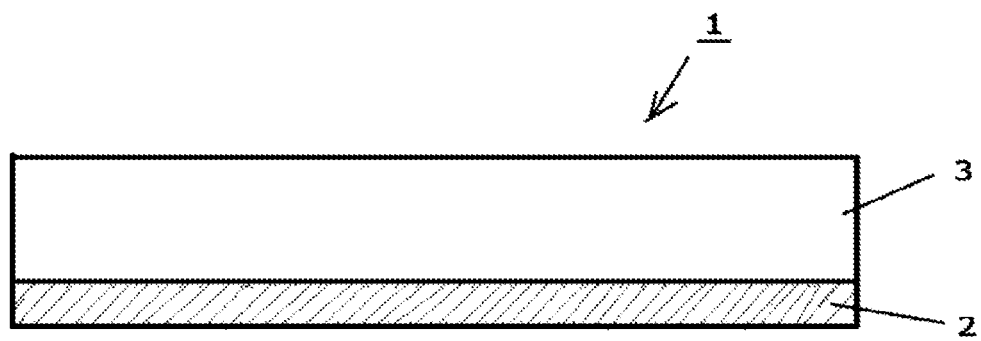
FIG. 1 is a schematic diagram showing a resin-attached metal foil of the present invention, and a resin layer of this resin-attached metal foil is in a B-stage state (semi-cured state).

A thermosetting resin composition of the present invention (hereinafter, also referred to as "resin composition of the present invention") is, as a presupposition, required not only to be used as a material for an electric insulator for an electronic part or the like but also to have a property of enabling efficient dissipation of heat generated in an electronic part. Therefore, the resin composition of the present invention basically comprises a rubber-like polymer compound and a filler as main components. Further, the resin composition of the present invention can also comprise an epoxy resin and a phenoxy resin for the purpose of imparting other desirable properties as an electric insulator or improving handling properties (workability or coating properties) of the resin composition.

Hereinafter, such components of the resin composition of the present invention will be described.

[Rubber-Like Polymer Compound (A) Having Glass Transition Temperature (Tg) of −40° C. Or Lower and Weight Average Molecular Weight (Mw) in Range of 8,000 to 50,000] (hereinafter, also referred to as rubber-like polymer compound (A))

As a rubber-like polymer compound (A) contained in the resin composition of the present invention, a rubber-like polymer compound having a glass transition temperature and a weight average molecular weight (Mw) each in a particular numerical value range can preferably be used. More specifically, a rubber-like polymer compound (A) having a glass transition temperature (Tg) of −40° C. or lower and a weight average molecular weight (Mw) in a range of 8,000 to 50,000 is suitably used in the present invention.

When the rubber-like polymer compound (A) has a glass transition temperature of −40° C. or lower, a cured product obtained from the resin composition comprising the rubber-like polymer compound (A) has a high thermal conductivity and has low elasticity, resulting in an enhancement of peel strength. A more preferred rubber-like polymer compound (A) has a glass transition temperature of −50° C. or lower.

On the other hand, when the rubber-like polymer compound (A) has a weight average molecular weight (Mw) in a range of 8,000 to 50,000, the tackiness of the resin composition comprising the rubber-like polymer compound (A) after coating and drying is favorable, a flow during a press for curing can be suppressed, and defoaming properties during drying is also favorable. In other words, the workability can be improved in that, for example, the coating properties and surface state of the resin composition are favorable, and protrusion and flow unevenness of the resin composition after being pressed can be suppressed. A more preferred rubber-like polymer compound (A) has a weight average molecular weight in a range of 10,000 to 50,000.

Further, the rubber-like polymer compound (A) in the present invention refers to a liquid polymer having a melt viscosity in a range of 0.1 to 10,000 Pas, measured at 38° C. The rubber-like polymer compound (A) is preferably liquid diene-based rubber for example.

The resin composition of the present invention, when comprising such a rubber-like polymer compound (A), can be a rubber composition exhibiting excellent processability and adhesive properties.

The raw material for the rubber-like polymer compound (A) is preferably a polymer obtained by polymerizing a conjugated diene. Examples of the conjugated diene include butadiene, isoprene, 2,3-dimethylbutadiene, 2-phenylbutadiene, 1,3-pentadiene, 2-methyl-1,3-pentadiene, 1,3-hexadiene, 1,3-octadiene, 1,3-cyclohexadiene, 2-methyl-1,3-octadiene, 1,3,7-octatriene, myrcene, and chloroprene. Among these conjugated dienes, butadiene and isoprene are preferable. One of these conjugated dienes may be used singly, or two or more of these conjugated dienes may be used together. Polymerization may be a method known to a person skilled in the art, and, for example, emulsion polymerization or solution polymerization can be used.

The rubber-like polymer compound (A) may be a rubber-like polymer compound obtained by copolymerizing an aromatic vinyl compound in addition to the conjugated diene. Examples of the aromatic vinyl compound include, but of course not limited to, styrene, α-methylstyrene, 2-methylstyrene, 3-methylstyrene, 4-methylstyrene, 4-propylstyrene, 4-t-butylstyrene, 4-cyclohexylstyrene, 4-dodecylstyrene, 2,4-dimethylstyrene, 2,4-diisopropylstyrene, 2,4,6-trimethylstyrene, 2-ethyl-4-benzylstyrene, 4-(phenylbutyl) styrene, 1-vinylnaphthalene, 2-vinylnaphthalene, vinylanthracene, N, N-diethyl-4-aminoethylstyrene, vinylpyridine, 4-methoxystyrene, monochlorostyrene, dichlorostyrene, and divinylbenzene. Among these aromatic vinyl compounds, styrene, α-methylstyrene, and 4-methylstyrene are preferable.

The rubber-like polymer compound (A) that is used in the present invention is preferably a rubber-like polymer compound having an isoprene or butadiene skeleton in the chemical structural formula thereof. Preferred examples of the rubber-like polymer compound include a homopolymer of isoprene or butadiene or a copolymer of isoprene and butadiene.

The rubber-like polymer compound (A) can of course be a commercially available product. Examples of the commercially available product include LIR-410, LIR-390, LBR-307, and LBR-305 (manufactured by Kuraray Co., Ltd.).

From the viewpoint of improving the workability and improving the peel strength of a cured product after curing, the rubber-like polymer compound (A) is preferably contained in an amount of 30 to 70 parts by mass, and is more preferably contained in an amount of 40 to 60 parts by mass, based on 100 parts by mass of the solid content (excluding inorganic fillers, such as filler (C)) in the resin composition of the present invention.

[Epoxy Resin (B)]

The resin composition preferably comprises an epoxy resin (B). The epoxy resin (B) has thermosetting properties, and therefore the solder heat resistance of a metal-based substrate having a cured product obtained from the resin composition comprising the epoxy resin (B) can be enhanced.

The epoxy resin (B) that is used in the present invention is preferably a liquid epoxy resin at normal temperature (25° C.). When the epoxy resin which is liquid at normal temperature is contained in the resin composition, the adhesiveness of the resultant cured product to a metal substrate is enhanced more, not to mention the solder heat resistance of a metal-based substrate, and therefore an advantage of enhancing the peel strength more is imparted.

Examples of such a liquid epoxy resin include, but of course not limited to, bisphenol A type epoxy resins, bisphenol F type epoxy resins, bisphenol AF type epoxy resins, naphthalene type epoxy resins, glycidyl ester type epoxy resins having an aromatic structure, glycidyl amine type epoxy resins having an aromatic structure, phenol novolak type epoxy resins, alicyclic epoxy resins having an ester skeleton having an aromatic structure, cyclohexane dimethanol type epoxy resins having an aromatic structure, and epoxy resins having an aromatic structure and having a butadiene structure.

One of these may be used singly, or two or more of these may be used in combination.

The liquid epoxy resin (B) may of course be a commercially available product. Examples of the commercially available product include HP4032, HP4032D, HP4032SS (naphthalene type epoxy resins) (manufactured by DIC Corporation), 828US, JER828EL (bisphenol A type epoxy resins), jER806, jER807 (bisphenol F type epoxy resins), jER152 (phenol novolak type epoxy resin), 630, 630LSD (glycidyl amine type epoxy resins) (manufactured by Mitsubishi Chemical Corporation), ZX1059 (mixture of bisphenol A type epoxy resin and bisphenol F type epoxy resin), jER871 (manufactured by NIPPON STEEL Chemical & Material CO., LTD.), EX-721 (glycidyl ester type epoxy resin) (manufactured by Nagase ChemteX Corporation), CELLOXIDE 2021P (alicyclic epoxy resin having ester skeleton) (manufactured by Daicel Corporation), and ZX1658 and ZX1658GS (liquid 1,4-glycidyl cyclohexane) (manufactured by NIPPON STEEL Chemical & Material CO., LTD.).

From the viewpoint of retaining the solder heat resistance required for the metal-based substrate of the present invention, the epoxy resin (B) is preferably contained in an amount of 20 to 45 parts by mass, and is more preferably contained in an amount of 25 to 40 parts by mass, based on 100 parts by mass of the solid content (excluding inorganic fillers, such as filler (C)) in the resin composition of the present invention.

[Filler (C)]

The metal-based substrate of the present invention needs to have electrically insulating properties and also have thermally conductive properties because of the uses thereof. Therefore, the resin composition of the present invention which is the material for the metal-based substrate comprises a filler (C) which can exhibit thermally conductive properties.

Examples of the filler (C) that is used in the present invention, include alumina, aluminum nitride, boron nitride, silicon carbide, and silicon nitride, and among these, alumina is particularly preferable. The filler (C) which can exhibit thermally conductive properties preferably has a thermal conductivity (20° C.) of 10 W/mK or more, more preferably 20 W/mK or more.

Further, from the viewpoint of enhancing moisture resistance and dispersibility, the filler (C) may be surface-treated with a surface treatment agent, such as a silane-based coupling agent.

One of these fillers (C) which can exhibit thermally conductive properties may be used singly, or two or more thereof may be used in combination. Further, two types or more of the same materials may be used in combination.

The filler (C) which can exhibit thermally conductive properties may be a commercially available product having a spherical shape or a pseudo-spherical shape. The use of spherical aluminum oxide can alleviate an increase in viscosity when the aluminum oxide is highly filled. Examples of such a commercially available product include, but of course not limited to, DAW-03, ASFP-20 (both manufactured by Denka Company Limited), and AS-40 (manufactured by Showa Denko K.K.).

The filler (C) preferably has an average grain size (d50) of 0.01 to 50 μm from the viewpoint of the thermally conductive properties of the metal-based substrate and the adhesiveness of the cured product to a metal substrate.

The average grain size can be measured by a laser diffraction/scattering method based on the Mie scattering theory. Specifically, the average grain size can be measured by acquiring a particle size distribution of the inorganic filler on a volume basis with a laser diffraction scattering particle size distribution analyzer and assuming the median size to be the average grain size. The filler (C) dispersed in water with ultrasonic waves can preferably be used as a sample for measurement. In addition, LA-500 (manufactured by HORIBA, Ltd.) and SALD2200 (manufactured by SHIMADZU CORPORATION) for example can be used as the laser diffraction scattering particle size distribution analyzer.

The filler (C) which can exhibit thermally conductive properties is contained in an amount such that the thermal conductivity is 3 W/mK or more in the resin composition of the present invention so that the metal-based substrate of the present invention can exhibit a function as an electrically insulating material having thermally conductive properties.

Specifically, the content of the filler (C) is preferably 65 to 85 parts by mass, more preferably 70 to 80 parts by mass, based on 100 parts by mass of the resin composition of the present invention.

[Phenoxy Resin (D)]

In the present invention, the resin composition preferably comprises a phenoxy resin (D) in order to improve the toughness of the cured product or to improve the adhesiveness between the cured product and a copper foil or between the cured product and a metal substrate.

Examples of the phenoxy resin (D) include phenoxy resins having one or more skeletons selected from the group consisting of bisphenol A skeletons, bisphenol F skeletons, bisphenol S skeletons, bisphenol acetophenone skeletons, novolak skeletons, biphenyl skeletons, fluorene skeletons, dicyclopentadiene skeletons, norbornene skeletons, naphthalene skeletons, anthracene skeletons, adamantane skeletons, terpene skeletons, and trimethylcyclohexane skeletons.

One of these phenoxy resins (D) may be used singly, or two or more of these phenoxy resins (D) may be used in combination. Further, among these, the phenoxy resin (D) that is used in the present invention is preferably a phenoxy resin having a softening point of 60 to 90° C. because an excessive flow during vacuum pressing is suppressed.

The phenoxy resin (D) may of course be a commercially available product. Examples of the commercially available product include 1256, 4250, YX8100, YX6954, YL7500BH30, YX6954BH30, YX7553, YX7553BH30, YL7769BH30, YL6794, YL7213, YL7290, and YL7482 (manufactured by Mitsubishi Chemical Corporation), and FX280 and FX293 (manufactured by NIPPON STEEL Chemical & Material CO., LTD.).

From the viewpoint of improving the toughness of the cured product of the present invention and improving the adhesiveness to a metal base material or a copper foil, the phenoxy resin (D) is preferably contained in an amount of 1 to 20 parts by mass based on 100 parts by mass of the solid content (excluding inorganic fillers, such as filler (C)) in the resin composition of the present invention.

[Curing Agent]

The resin composition of the present invention may further comprise a curing agent in addition to the above-described components (A) to (D) for the purpose of adjusting the curing time for the resin composition to improve the workability of the resin composition.

Examples of such a curing accelerator which is used in the present invention include organic phosphine compounds, such as TPP, TPP-K, TPP-S and TPTP-S (manufactured by HOKKO CHEMICAL INDUSTRY CO., LTD.), imidazole compounds, such as CUREZOL 2MZ, 2E4MZ, 2PZ, 1B2PZ, C11Z, C11Z-CN, C11Z-CNS, C11Z-A, 2MZ-OK, 2MA-OK, and 2PHZ (manufactured by SHIKOKU CHEMICALS CORPORATION), amine adduct compounds, such as NOVACURE (manufactured by Asahi Kasei Corp.) and Fujicure (manufactured by T&K TOKA CO., LTD.), amine compounds, such as 1,8-diazabicyclo [5,4,0] undecene-7,4-dimethylaminopyridine, benzyl dimethylamine, 2,4,6-tris(dimethylaminomethyl) phenol, and 4-dimethylaminopyridine, and organic metal complexes or organic metal salts of cobalt, copper, zinc, iron, nickel, manganese, tin, and the like. Two or more of these curing accelerators may of course be used together.

Such a curing agent can be contained in the resin composition in an amount such that the curing rate of the resin composition of the present invention can be changed. The content of the curing agent is preferably 0.5 to 2 parts by mass based on 100 parts by mass of the solid content (excluding inorganic fillers, such as filler (C)) in the resin composition of the present invention.

[Solvent]

Further, the resin composition of the present invention may be diluted with a solvent, such as an organic solvent, in order to, for example, adjust the viscosity thereof.

The organic solvent can be used in order to prepare the thermosetting resin composition of the present invention or adjust the viscosity for coating a base material. Any of known organic solvents can be used as the organic solvent.

Examples of the organic solvent include ketones, aromatic hydrocarbons, glycol ethers, glycol ether acetates, esters, alcohols, aliphatic hydrocarbons, and petroleum-based solvents. More specific examples of the organic solvent include ketones, such as methyl ethyl ketone and cyclohexanone; aromatic hydrocarbons, such as toluene, xylene, and tetramethylbenzene; glycol ethers, such as cellosolve, methyl cellosolve, butyl cellosolve, carbitol, methyl carbitol, butyl carbitol, propylene glycol monomethyl ether, dipropylene glycol monomethyl ether, dipropylene glycol monoethyl ether, dipropylene glycol diethyl ether, and triethylene glycol monoethyl ether; esters, such as ethyl acetate, butyl acetate, dipropylene glycol methyl ether acetate, propylene glycol methyl ether acetate, propylene glycol ethyl ether acetate, and propylene glycol butyl ether acetate; alcohols, such as ethanol, propanol, ethylene glycol, and propylene glycol; aliphatic hydrocarbons, such as octane and decane; and petroleum-based solvents, such as petroleum ether, petroleum naphtha, hydrogenated petroleum naphtha, and solvent naphtha. One of these organic solvents may be used singly, or these organic solvents may be used as a mixture of two or more thereof.

The solvent can appropriately be contained in the resin composition in an amount such that the viscosity of the resin composition of the present invention can be adjusted to a desired level.

[Wetting Dispersant]

As described above, the resin composition of the present invention comprises the filler (C). Accordingly, the resin composition preferably comprises a wetting dispersant for the purpose of favorable dispersion of the filler (C) in the resin composition.

Examples of the wetting dispersant which is a commercially available product include ANTI-TERRA-U, ANTI-TERRA-U100, ANTI-TERRA-204, ANTI-TERRA-205, DISPERBYK-101, DISPERBYK-102, DISPERBYK-103, DISPERBYK-106, DISPERBYK-108, DISPERBYK-109, DISPERBYK-110, DISPERBYK-111, DISPERBYK-112, DISPERBYK-116, DISPERBYK-130, DISPERBYK-140, DISPERBYK-142, DISPERBYK-145, DISPERBYK-161, DISPERBYK-162, DISPERBYK-163, DISPERBYK-164, DISPERBYK-166, DISPERBYK-167, DISPERBYK-168, DISPERBYK-170, DISPERBYK-171, DISPERBYK-174, DISPERBYK-180, DISPERBYK-182, DISPERBYK-183, DISPERBYK-185, DISPERBYK-184, DISPERBYK-2000, DISPERBYK-2001, DISPERBYK-2009, DISPERBYK-2020, DISPERBYK-2025, DISPERBYK-2050, DISPERBYK-2070, DISPERBYK-2096, DISPERBYK-2150, BYK-P104, BYK-P104S, BYKP105, BYK-9076, BYK-9077, BYK-220S, BYK-1160, BYK-1165, BYK-W903, BYK-W908, BYK-W909, BYK-W940, BYK-W961, BYK-W966, BYK-W969, BYK-W972, BYK-W974, BYK-W980, BYK-W985, BYK-W995, BYK-W996, BYK-W9010, BYK-W9011, BYK-9012 (all manufactured by BYK Japan KK), DISPARLON 2150, DISPARLON 1210, DISPARLON KS-860, DISPARLON KS-873N, DISPARLON 7004, DISPARLON 1830, DISPARLON 1860, DISPARLON 1850, DISPARLON DA-400N, DISPARLON PW-36, DISPARLON DA-703-50 (all manufactured by Kusumoto Chemicals, Ltd.), FLOWLEN G-450, FLOWLEN G-600, FLOWLEN G-820, FLOWLEN G-700, FLOWLEN DOPA-44, and FLOWLEN DOPA-17 (manufactured by Kyoeisha Chemical Co., Ltd.).

The content of the wetting dispersant in the resin composition of the present invention is 0.1 parts by mass or more and 10 parts by mass or less, preferably 0.1 parts by mass or more and 5 parts by mass or less, based on 100 parts by mass of the filler (C).

[Silane Coupling Agent]

The resin composition of the present invention preferably comprises a silane coupling agent in order to enhance the dispersibility of each component during mixing in the production of the resin composition. When the dispersibility is enhanced, an advantage of enhancing the mechanical properties of the cured product or the adhesiveness to a metal substrate is thereby imparted.

The silane coupling agent can also be used in advance for the surface treatment of the above-described component, the filler (C).

Examples of the silane coupling agent include, but not limited to, vinyl-based silane coupling agents, epoxy-based silane coupling agents, styryl-based silane coupling agents, methacrylic silane coupling agents, acrylic silane coupling agents, amino-based silane coupling agents, isocyanurate-based silane coupling agents, ureide-based silane coupling agents, mercapto-based silane coupling agents, isocyanate-based silane coupling agents, and acid anhydride-based silane coupling agents.

The silane coupling agent may also be a commercially available product. Examples of the commercially available product include KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103P, KBM-573, KBM-575, KBM-9659, KBE-585A, KBM-802, KBM-803, KBE-9007N, and X-12-967C (manufactured by Shin-Etsu Chemical Co., Ltd.).

The content of the silane coupling agent in the resin composition of the present invention can appropriately be set according to the desired degree of dispersion, and the content of the silane coupling agent is preferably 0.5 to 2 parts by mass based on 100 parts of the resin composition of the present invention.

[Other Additives]

Besides the above-described components, the resin composition of the present invention can comprise an antioxidant, a deformer/leveling agent, and the like.

The antioxidant suppresses oxidation of a conductor (copper) on a base material to improve the adhesiveness between a base material and a cured film of the thermosetting resin composition of the present invention. Examples of the antioxidant include hindered phenol compounds, such as 3-(N-salicyloyl)amino-1,2,4-triazole, sulfur-based antioxidants, such as a zinc salt of 2-mercaptobenzimidazole, phosphorus-based antioxidants, such as triphenyl phosphite, aromatic amine-based antioxidants, such as di-tert-butyldiphenylamine, and heterocyclic compounds containing nitrogen as a hetero atom, such as melamine, benzotriazole, and tolyltriazole. Among others, the antioxidant is preferably melamine or benzotriazole, particularly preferably melamine.

When the antioxidant is contained, the content of the antioxidant is 0.03% by mass or more and 5% by mass or less, preferably 0.1% by mass or more and 2% by mass or less, based on the solid content (excluding inorganic fillers, such as filler (C)) in the resin composition of the present invention.

On the other hand, a defoamer or a leveling agent can be blended in order to prevent degradation of the surface smoothness and prevent degradation of interlayer insulating properties due to a void or a pinhole.

Examples of the defoamer (leveling agent) include silicone-based defoamers and non-silicone-based defoamers which are foam-breaking polymer solutions, and examples of silicone-based defoamers which are commercially available products include BYK(R)-063, BYK-065, BYK-066N, BYK-067A, BYK-077 (all manufactured by BYK Japan KK), and KS-66 (manufactured by Shin-Etsu Chemical Co., Ltd.).

Examples of the non-silicone-based defoamers which are commercially available include BYK-054, BYK-055, BYK-057, BYK-1790, and BYK-1791 (all manufactured by BYK Japan KK).

When the defoamer (leveling agent) is contained, the content of the defoamer (leveling agent) is 10% by mass or less, preferably 0.01% by mass or more and 3% by mass or less, based on the solid content (excluding inorganic fillers, such as filler (C)) in the resin composition of the present invention.

[Resin-attached Metal Foil]

A resin-attached metal foil of the present invention has a B-stage state (semi-cured state) resin layer obtained by applying the resin composition of the present invention on a metal foil or a metal foil surface of a carrier-attached metal foil, and heating and drying the resin composition, for example, at a temperature of 80° C. for about 30 minutes. For example, a resin-attached metal foil 1 shown in FIG. 1 has a resin layer as an electrically insulating layer 3 (B-stage state (semi-cured state)) on a copper foil 2 as the metal foil.

[Carrier-Attached Metal Foil]

The carrier-attached metal foil may include a carrier foil and a metal foil in the mentioned order, and the resin layer obtained from the resin composition of the present invention may be laminated such that the resin layer is in contact with the metal foil. An ultrathin copper foil is preferably used as the metal foil.

Examples of the carrier foil include a copper foil, an aluminum foil, a stainless steel (SUS) foil, and a resin film whose surface has been coated with a metal, and the carrier foil is preferably a copper foil. The copper foil may be an electrolytic copper foil or a rolled copper foil. The carrier foil has a thickness of usually 250 μm or less, preferably 9 to 200 μm. Note that a release layer may be formed as necessary between the carrier foil and the metal foil.

The method for forming the copper foil is not particularly limited, but the copper foil is preferably an ultrathin copper foil and can be formed by a wet film-forming method, such as an electroless copper plating method or an electrolytic copper plating method, a dry film-forming method, such as sputtering or chemical vapor deposition, or a combination thereof. The ultrathin copper foil preferably has a thickness of 0.1 to 7.0 μm, more preferably 0.5 to 5.0 μm, and still more preferably 1.0 to 3.0 μm.

[B-Stage State (Semi-Cured State) Resin Layer]

The B-stage state (semi-cured state) resin layer of the present invention is obtained by heating and drying the resin composition of the present invention, for example, at a temperature of 80° C. for about 30 minutes. The B-stage state (semi-cured state) resin layer itself is usually not produced singly, but can be produced as a resin-attached metal foil obtained by, for example, applying the resin composition of the present invention on a carrier-attached metal foil, and heating and drying the resin composition at a temperature of 80° C. for about 30 minutes.

Further, the B-stage state (semi-cured state) resin layer of the present invention can be produced as a dry film including the B-stage state (semi-cured state) resin layer formed on a carrier film by using a PET film as the carrier film, applying the thermosetting resin composition on the carrier film with an applicator, and heating and drying the thermosetting resin composition at a temperature of 80° C. for about 30 minutes.

[Metal-Based Substrate]

Figure 2:
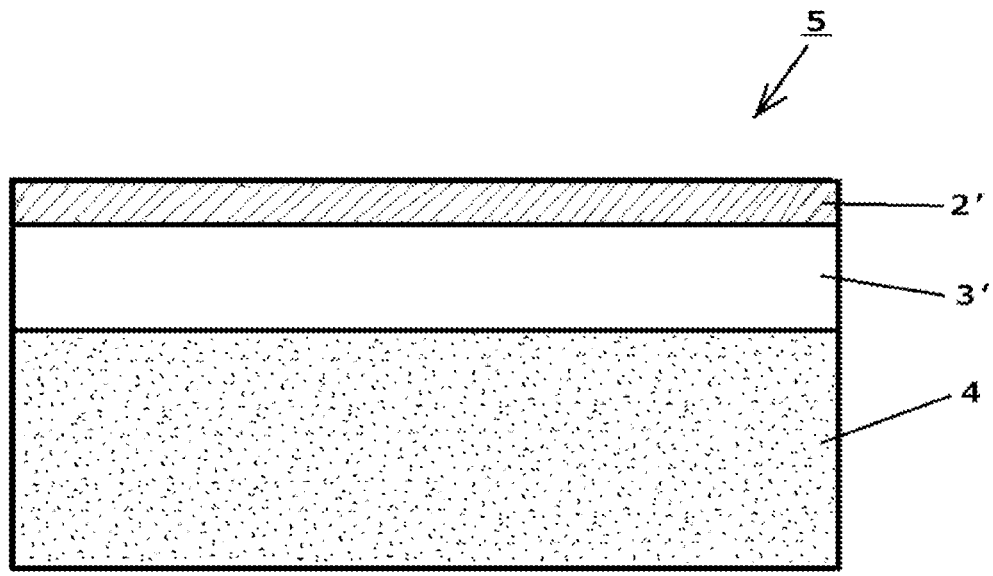
FIG. 2 is a schematic diagram showing one aspect of a metal-based substrate of the present invention.

As for a method for preparing the metal-based substrate of the present invention, a metal-based substrate 5 composed of three layers of a copper foil 2', an electrically insulating layer 3' (cured product), and a metal sheet (aluminum sheet) 4 can be produced by, for example, overlaying a surface of the resin layer of the resin-attached metal foil (copper foil) of the present invention on a metal substrate, such as aluminum, and heating and pressurizing the resin-attached metal foil and the metal substrate with a vacuum press, for example, at 190° C. and 10 MPa for 60 minutes to cure the resin layer (FIG. 2). The method is preferable because thereby the filler (C) in the resin layer can be most closely filled.

Figure 3:
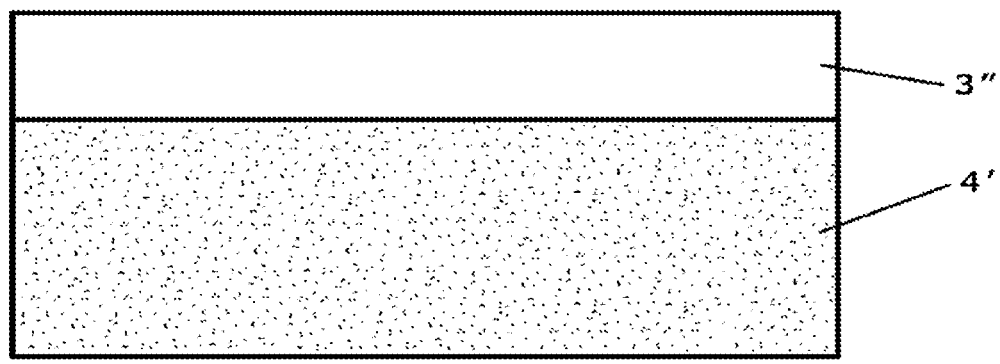
FIG. 3 is a schematic diagram showing a laminated body composed of a metal sheet (aluminum sheet) and a B-stage state (semi-cured state) resin layer on the metal sheet (aluminum sheet).

Further, as for another method for preparing the metal-based substrate of the present invention, the metal-based substrate of the present invention can be produced by applying the resin composition of the present invention on a metal sheet (aluminum sheet) 4', and heating and drying the resin composition to form a B-stage state (semi-cured state) resin layer (electrically insulating layer 3" (B-stage state (semi-cured state))) (FIG. 3); and heating and pressurizing a metal foil on this resin layer, for example, at 190° C. and 10 MPa for 60 minutes to cure the resin layer and mold the metal foil on the resin layer.

Figure 4:
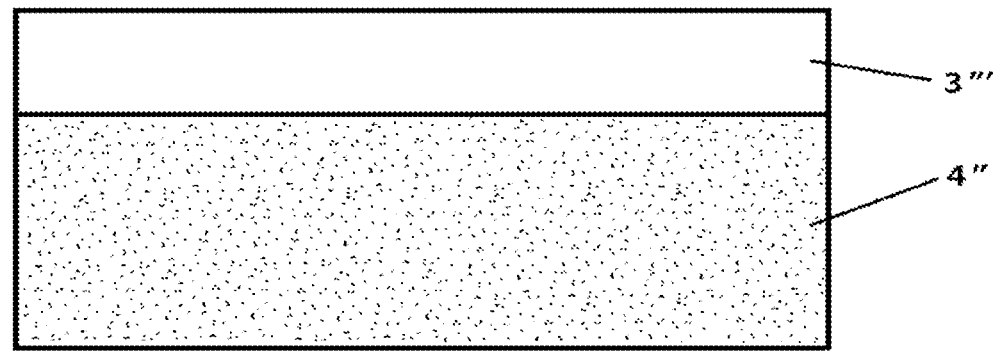
FIG. 4 is a schematic diagram showing a two-layered part obtained by removing a copper foil of a metal-based substrate by etching and composed of an electrically insulating layer (cured product) and a metal sheet (aluminum sheet).

FIG. 4 is a diagram showing a two-layered part obtained by removing the copper foil of the metal-based substrate by etching and composed of an electrically insulating layer 3''' (cured product) and a metal sheet (aluminum sheet) 4''.

The cured product itself is desirably a thin film from the viewpoint of thermally conductive properties, but preferably has a thickness of 75 μm to 200 μm taking withstand voltage properties into consideration.

Examples of the metal substrate include a copper foil or an aluminum foil, but the metal substrate is more preferably a copper foil. The copper foil may be a monometal of copper or may be a foil composed of an alloy of copper with another metal, such as tin, chromium, silver, magnesium, nickel, zirconium, silicon, or titanium.

The metal substrate has a thickness of approximately in a range of 0.1 mm to 5 mm, preferably in a range of 0.5 mm to 3 mm.

{Metal-Based Substrate} (Double-Sided Sheet)

A metal core substrate can be produced by overlaying a surface of the resin layer of the resin-attached metal foil (copper foil) of the present invention on each surface of a metal sheet, and heating and pressurizing the resin-attached metal foil and the metal sheet with a vacuum press, for example, at 190° C. and 10 MPa for 60 minutes to cure the resin layer.

Further, as for another method for preparing the metal core substrate of the present invention, the metal core substrate of the present invention can be produced by applying the resin composition of the present invention on each surface of a metal substrate, and heating and drying the resin composition to form a B-stage state (semi-cured state) resin layer (electrically insulating layer); and heating and pressurizing a metal foil on the electrically insulating layer with a vacuum press at 190° C. and 10 MPa for 60 minutes to cure the resin layer and mold the metal foil on the electrically insulating layer.

[Electronic Part]

The cured product, laminated body, and metal-based substrate of the present invention can suitably be used as, for example, an electronic part for electric products (such as PCs, smartphones, TVs, and radios) and vehicles (such as automobiles, trains, ships, and airplanes) or, for example, an electric insulator having thermally conductive properties for semiconductor apparatuses and power devices.

Hereinafter, one aspect of the present invention will specifically be described with reference to Examples, which of course is not intended to limit the scope of the present invention according to the claims of the present application.

Each of "parts" and "%" described herein is on a mass basis unless otherwise noted.

EXAMPLES

Production of Resin Compositions of Examples 1 to 5 and Comparative Examples 1 to 4

Respective materials were blended and added according to the compositions and ratios described in Table 1 below, and resultant mixtures were stirred and deaerated for 5 minutes with a centrifugal deaerating and stirring machine to produce each of the resin compositions of Examples 1 to 5 and Comparative Examples of 1 to 4.

aluminum substrate having a thickness of 1.0 mm to perform heating and pressurization with a vacuum press at 190° C. and 10 MPa for 60 minutes for curing, and thus metal-based laminated sheets composed of three layers of an aluminum

TABLE 1

Components and blending amounts thereof (unit: part by mass) in resin compositions of Examples 1 to 5 and Comparative Examples 1 to 4

|  | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| (A) Isoprene rubber[*1] | 4 | 4 | — | — | — | — | — | — | — |
| (A) Isoprene rubber[*2] | — | — | 4 | — | — | — | — | — | — |
| (A) Butadiene rubber[*3] | — | — | — | 4 | — | — | — | — | — |
| (A) Butadiene rubber[*4] | — | — | — | — | 4 | — | — | — | — |
| Isoprene rubber[*5] | — | — | — | — | — | 4 | — | — | — |
| Acrylic rubber[*6] | — | — | — | — | — | — | — | — | — |
| Butadiene rubber[*7] | — | — | — | — | — | — | — | 4 | — |
| Polyester-based urethane oligomer[*8] | — | — | — | — | — | — | — | — | 4 |
| (B) Dimer acid glycidyl ester[*9] | 2.5 | — | 2.5 | 2.5 | 2.5 | 2.5 | 2.5 | 2.5 | 2.5 |
| (B) Mixed epoxy resin[*10] | — | 2.5 | — | — | — | — | — | — | — |
| Wetting dispersant[*11] | 0.2 | 0.2 | 0.2 | 0.2 | 0.2 | 0.2 | 0.2 | 0.2 | 0.2 |
| 3-Glycidoxypropyltrimethoxysilane[*12] | 1 | 1 | 1 | 1 | 1 | 1 | 1 | 1 | 1 |
| (D) Phenoxy resin[*13] | 1 | 1 | 1 | 1 | 1 | 1 | 1 | 1 | 1 |
| Curing agent[*14] | 0.1 | 0.1 | 0.1 | 0.1 | 0.1 | 0.1 | 0.1 | 0.1 | 0.1 |
| Solvent[*15] | 15 | 15 | 15 | 15 | 15 | 15 | 15 | 15 | 15 |
| (C) alumina[*16] | 56 | 56 | 56 | 56 | 56 | 56 | 56 | 56 | 56 |
| (C) alumina[*17] | 14 | 14 | 14 | 14 | 14 | 14 | 14 | 14 | 14 |
| (C) alumina[*18] | 7 | 7 | 7 | 7 | 7 | 7 | 7 | 7 | 7 |
| Total | 100.8 | 100.8 | 100.8 | 100.8 | 100.8 | 100.8 | 100.8 | 100.8 | 100.8 |
| Solid content mass (g) | 85.8 | 85.8 | 85.8 | 85.8 | 85.8 | 85.8 | 85.8 | 85.8 | 85.8 |

[*1]LIR-410 (manufactured by Kuraray Co., Ltd.; Mw: 30,000; Tg: −59° C.; melt viscosity (38° C.): 430 Pa · s)
[*2]LIR-390 (manufactured by Kuraray Co., Ltd.; Mw: 48,000; Tg: −95° C.; melt viscosity (38° C.): 400 Pa · s)
[*3]LBR-307 (manufactured by Kuraray Co., Ltd.; Mw: 10,000; Tg: −95° C.; melt viscosity (38° C.): 1.5 Pa · s)
[*4]LBR-305 (manufactured by Kuraray Co., Ltd.; Mw: 26,000; Tg: −95° C.; melt viscosity (38° C.): 40 Pa · s)
[*5]LIR-50 (manufactured by Kuraray Co., Ltd.; Mw: 54, 000; Tg: −63° C.; melt viscosity (38° C.): 500 Pa · s)
[*6]Nipol AR-53L (manufactured by Zeon Corporation; Mw: 1,500,000; Tg: −32° C.)
[*7]LBR-302 (manufactured by Kuraray Co., Ltd.; Mw: 5,500; Tg: −85° C.; melt viscosity (38° C.): 0.6 Pa · s)
[*8]UF-3003M (manufactured by Kyoeisha Chemical Co., Ltd.; Mw: 20,000; Tg: −33° C.)
[*9]jER871 (manufactured by Mitsubishi Chemical Corporation)
[*10]ZX1059 (manufactured by NIPPON STEEL Chemical & Material CO., LTD.; mixture of bisphenol A and bisphenol F)
[*11]BYK-W9010 (manufactured by BYK-Chemie GmbH, copolymer having acidic group)
[*12]KBM-403 (manufactured by Shin-Etsu Chemical Co., Ltd.)
[*13]4250 (manufactured by Mitsubishi Chemical Corporation; mixed type of bisphenol A and bisphenol F; Mw: 60,000)
[*14]CUREZOL 1B2PZ (manufactured by SHIKOKU CHEMICALS CORPORATION; 1-benzyl-2-phenylimidazole)
[*15]ANON (manufactured by UBE Corporation; cyclohexanone)
[*16]AS-30 (manufactured by Showa Denko K.K.; alumina powder; d50: 18 μm)
[*17]DAW-03 (manufactured by Denka Company Limited; alumina powder; d50: 4 μm)
[*18]ASFP-20 (manufactured by Denka Company Limited; alumina powder; d50: 0.3 μm)

[Method for Measuring Melt Viscosity]

The melt viscosity of the rubber-like polymer compound (A) at 38° C. was measured with a Brookfield viscometer (manufactured by BROOKFIELD ENGINEERING LABS. INC.).

[Method for Measuring Glass Transition Temperature (Tg)]

In an aluminum pan, 10 mg of the rubber-like polymer compound (A) was sampled to acquire a thermogram by differential scanning calorimetry (DSC) under a temperature-increasing condition of 10° C./min, and a value at the peak top in DSC was determined to be the glass transition temperature.

[Preparation of Substrates]

The obtained resin compositions of Examples 1 to 5 and Comparative Examples 1 to 4 were applied respectively on one surface of a copper foil having a thickness of 35 μm with a bar coater and heated at 80° C. for 30 minutes with a hot-air circulation drying furnace to dry the solvent, and thus B-stage state (semi-cured state) resin layers having a thickness of 100 μm were prepared respectively. Next, the B-stage state (semi-cured state) resin layers previously formed on the copper foil were overlayed respectively on an aluminum substrate, an electrically insulating layer, and the copper foil were prepared respectively.

[Test Example 1] Coating Property Surface State

The resin compositions of Examples 1 to 5 and Comparative Examples 1 to 4 were diluted and applied respectively on a copper foil with a bar coater such that the dry thickness was 100 μm. Further, drying was performed at 80° C. for 30 minutes with a hot-air circulation drying furnace of a box type, and the appearance of the surface of the coating film of each B-stage state (semi-cured state) resin layer after the drying was visually evaluated. The evaluation criteria are as follows.

Evaluation criteria: ⊚: Neither a bubble nor a cissing is present and the appearance is uniform without a defect.

○: Neither a bubble nor a cissing is present, but a projection or a dent is present on the coating film.

X: A bubble or a cissing is present.

Results are shown in Table 2 below.

[Test Example 2] Protrusion after Pressing

Test substrates of Examples 1 to 5 and Comparative Examples 1 to 4 were prepared respectively by the same method as in [Preparation of Substrates]. Then, the degree of flowability of each resin composition from the edge of the copper foil and the aluminum sheet was visually evaluated. The evaluation criteria are as follows.

Evaluation criteria: ○: The resin composition is not protruded, or an extremely small amount of the resin composition is protruded and uniform molding can be performed.
X: A large amount of the resin composition is protruded and the film at each end surface of the press is thin.
Results are shown in Table 2 below.

[Test Example 3] Flow Unevenness after Pressing

Test substrates of Examples 1 to 5 and Comparative Examples 1 to 4 were prepared respectively by the same method as in [Preparation of Substrates]. Then, the copper foils were peeled to visually evaluate whether unevenness was present on the residual resin layers. The evaluation criteria are as follows.

Evaluation criteria: ○: Uniform molding can be performed.
X: Unevenness in the film thickness, color unevenness, a wrinkle are present depending on the spot.
Results are shown in Table 2 below.

[Test Example 4] Solder Heat Resistance

Test substrates (50 mm×50 mm) of Examples 1 to 5 and Comparative Examples 1 to 4 were prepared respectively by the same method as in [Preparation of Substrates]. Then, those test substrates were floated on a solder tank set at 260° C. for 30 minutes with their aluminum substrates down. Thereafter, whether swelling or peeling of each test substrate was present or not was visually evaluated. The evaluation criteria are as follows.

Evaluation criteria: ○: Neither swelling nor peeling is observed.
X: Peeling or swelling is observed.
Results are shown in Table 2 below.

[Test Example 5] Withstand Voltage Property

The copper foils of the test substrates of Examples 1 to 5 and Comparative Examples 1 to 4 were etched to prepare samples each including a copper foil land having a diameter of 20 mm formed thereon. Then, the withstand voltage was measured using a withstand voltage tester TOS5051A manufactured by KIKUSUI ELECTRONICS CORPORATION. The withstand voltage measurement was started from AC 1 kV, the voltage was increased at a rate of 25 V/see, and the lowest voltage at which dielectric breakdown occurred to the sample was determined to be the withstand voltage of the sample. The evaluation criteria are as follows.

Evaluation criteria: 4 or higher: ◎
3 or higher: ○ (Lower
than 3: X
Measurement impossible: –
Results are shown Table 2 below.

[Test Example 6] Peel Strength

Each of the copper foils of the test substrates of Examples 1 to 5 and Comparative Examples 1 to 4 cut into a predetermined size was partially removed by etching to form a copper foil pattern having a width of 10 mm. Then, an edge of this copper foil pattern was peeled, and the copper foil pattern was peeled off at a rate of 50 mm/min while force was applied vertically to the surface of the electrically insulating layer of each test substrate. The force applied to the copper foil pattern on that occasion was defined as the T peel strength, and the T peel strength was measured with AUTOGRAPH AG-X manufactured by SHIMADZU CORPORATION. The evaluation criteria are as follows.

Evaluation criteria: Higher than 10: ◎
5 or higher and 10 or lower: ○
Lower than 5: ×
Measurement impossible: –
Results are shown Table 2 below.

[Test Example 7] Glass Transition Temperature (Tg) (DMA)

The resin compositions of Examples 1 to 5 and Comparative Examples 1 to 4 were applied on a copper foil with a bar coater respectively, and heated and dried at 80° C. for 30 minutes with a hot-air circulation drying furnace to prepare B-stage state (semi-cured state) resin layers, and then a copper foil was overlayed on each of the resin layers and heated with a vacuum press machine at 190° C. and 10 MPa for 60 minutes for curing, and then immersed for 30 minutes in a soft etching agent CB801 manufactured by MEC COMPANY LTD. which was heated at 30° C., and thus the copper foil was removed by etching to prepare a single film of an electrically insulating layer for each resin composition. Then, the glass transition temperature (Tg) was measured for the single films with Solids Analyzer RSA-G2 manufactured by TA Instruments. Results are shown in Table 2 (unit: ° C.).

[Test Example 8.] Storage Modulus (E' @25)

Single films of electrically insulating layers of Examples 1 to 5 and Comparative Examples 1 to 4 were prepared respectively in the same manner as in Test Example 7, and the storage modulus at 25° C. was measured for the single films with Solids Analyzer RSA-G2 manufactured by TA Instruments setting the frequency to 1 Hz. The evaluation criteria are as follows.

Evaluation criteria: 1 GPa or lower: ◎
Higher than 1 GPa and 2 GPa or lower: ○
Higher than 2 GPa: X
Measurement impossible: –
Results are shown Table 2 below.

[Test Example 9] Thermal Conductivity

The resin compositions of Examples 1 to 5 and Comparative Examples 1 to 4 were applied respectively on one surface of a copper foil having a thickness of 35 μm and then heated at 80° C. for 30 minutes with a hot-air circulation drying furnace to dry the solvent, and thus electrically insulating layers which are B-stage state (semi-cured state) resin layers having a thickness of 100 μm were prepared respectively. A copper foil was overlayed on each of these electrically insulating layers formed on the copper foil, and was heated and pressurized at 190° C. and 10 MPa for 60 minutes with a vacuum press for curing, and then the copper foil was peeled to give film-like cured products. Then, the thermal conductivity was measured for these film-like cured products with QTM500 manufactured by Kyoto Electronics Manufacturing Co., Ltd. The average value of n=3 was determined to be the thermal conductivity (W/mK).

The results, which are omitted from the description in Table 2, showed that all of the film-like cured products of Examples 1 to 5 and Comparative Examples 2 and 4 had a thermal conductivity of 3 W/mK or more. In Comparative Examples 1 and 3, a sheet was not able to be shaped and therefore the measurement was impossible.

TABLE 2

Test results of Examples 1 to 5 and Comparative Examples 1 to 4

| | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Coating property Surface state | ◎ | ◎ | ◎ | ○ | ○ | X | ○ | ○ | ○ |
| Protrusion after pressing | ○ | ○ | ○ | ○ | ○ | ○ | ○ | X | ○ |
| Flow unevenness after pressing | ○ | ○ | ○ | ○ | ○ | X | ○ | X | ○ |
| Solder heat resistance (260° C., 30 min) | ○ | ○ | ○ | ○ | ○ | ○ | X | X | X |
| Withstand voltage (kV/0.1 mm) | 4.2 ◎ | 4.0 ◎ | 4.7 ◎ | 3.2 ○ | 3.3 ○ | 1.7 X | 2.1 X | 0.7 X | 1.5 X |
| Peel strength (N) | >10 | >10 | 10 | 7 | >10 | Measurement impossible | Measurement impossible | Measurement impossible | 8 |
| Aluminum | ◎ | ◎ | ○ | ○ | ◎ | — | — | — | ◎ |
| Tg(DMA) (° C.) | −48 | −42 | −48 | −44 | −45 | Measurement impossible | −19 | Measurement impossible | −30 |
| Storage modulus (E' @25) Strage modulus (GPa) | 0.4 ◎ | 1.2 ○ | 0.6 ◎ | 0.6 ◎ | 0.8 ◎ | Measurement impossible — | 0.1 ◎ | Measurement impossible — | 3.3 X |

REFERENCE SIGNS LIST

1 Resin-attached metal foil
2, 2' Copper foil
3, 3', 3", 3''' Electrically insulating layer
4, 4', 4" Metal sheet (aluminum sheet)
5 Metal-based substrate

The invention claimed is:

1. A thermosetting resin composition, comprising:
 a rubber-like polymer compound having a glass transition temperature of −40° C. or lower and a weight average molecular weight in a range of 8,000 to 50,000;
 an epoxy resin;
 a filler; and
 a phenoxy resin.

2. The thermosetting resin composition according to claim 1, wherein the rubber-like polymer compound has an isoprene skeleton or a butadiene skeleton.

3. The thermosetting resin composition according to claim 1, wherein the epoxy resin is liquid at normal temperature of 25° C.

4. A resin-attached metal foil, comprising:
 a metal foil or a carrier-attached metal foil; and
 a B-stage state resin layer obtained by a process comprising heating and drying the thermosetting resin composition of claim 1 on the metal foil or the carrier-attached metal foil.

5. A dry film, comprising:
 a carrier film; and
 a B-stage state resin layer obtained by a process comprising heating and drying the thermosetting resin composition of claim 1 on the carrier film.

6. A cured product obtained by a process comprising curing the resin layer of the resin-attached metal foil of claim 4.

7. A metal-based substrate, comprising:
 a metal substrate; and
 the cured product of claim 6 on the metal substrate.

8. A method for producing a metal-based substrate, comprising:
 overlaying a resin layer side of the resin-attached metal foil of claim 4 on one surface or each surface of a metal substrate; and
 heating and pressurizing the resin-attached metal foil and the metal substrate with a vacuum press to obtain the metal-based substrate.

9. A method for producing a metal-based substrate, comprising:
 overlaying a metal foil on a metal substrate having a B-stage state resin layer obtained by a process comprising applying, heating and drying the thermosetting resin composition of claim 1; and
 heating and pressurizing the metal foil and the metal substrate with a vacuum press to obtain the metal-based substrate.

10. A method for producing an electronic part, comprising:
 using the cured product of claim 6.

11. A method for producing an electronic part, comprising:
 using the metal-based substrate of claim 7.

12. A method for producing an electronic part, comprising:
 using the metal-based substrate obtained by the method of claim 8.

13. A method for producing an electronic part, comprising:
  using the metal-based substrate obtained by the method of claim 9.

14. The thermosetting resin composition according to claim 2, wherein the epoxy resin is liquid at normal temperature of 25° C.

15. A resin-attached metal foil, comprising:
  a metal foil or a carrier-attached metal foil; and
  a B-stage state resin layer obtained by a process comprising heating and drying the thermosetting resin composition of claim 2 on the metal foil or the carrier-attached metal foil.

16. A dry film, comprising:
  a carrier film; and
  a B-stage state resin layer obtained by a process comprising heating and drying the thermosetting resin composition of claim 2 on the carrier film.

17. A cured product obtained by a process comprising curing the resin layer of the dry film of claim 5.

18. A method for producing a metal-based substrate, comprising:
  overlaying a metal foil on a metal substrate having a B-stage state resin layer obtained by a process comprising applying, heating and drying the thermosetting resin composition of claim 2; and
  heating and pressurizing the metal foil and the metal substrate with a vacuum press to obtain the metal-based substrate.

19. A resin-attached metal foil, comprising:
  a metal foil or a carrier-attached metal foil; and
  a B-stage state resin layer obtained by a process comprising heating and drying the thermosetting resin composition of claim 3 on the metal foil or the carrier-attached metal foil.

20. A dry film, comprising:
  a carrier film; and
  a B-stage state resin layer obtained by a process comprising heating and drying the thermosetting resin composition of claim 3 on the carrier film.

* * * * *